Aug. 12, 1969 D. M. JACKSON, JR 3,461,003

METHOD OF FABRICATING A SEMICONDUCTOR STRUCTURE WITH AN ELECTRICALLY ISOLATED REGION OF SEMICONDUCTOR MATERIAL

Filed Dec. 14, 1964 2 Sheets-Sheet 1

INVENTOR.
Don M. Jackson, Jr.

BY Mueller & Aichele

ATTYS.

INVENTOR.
Don M. Jackson, Jr.
BY Mueller & Aichele
ATTYS.

United States Patent Office
3,461,003
Patented Aug. 12, 1969

3,461,003

METHOD OF FABRICATING A SEMICONDUCTOR STRUCTURE WITH AN ELECTRICALLY ISOLATED REGION OF SEMICONDUCTOR MATERIAL

Don M. Jackson, Jr., Scottsdale, Ariz., assignor to Motorola, Inc., Franklin Park, Ill., a corporation of Illinois Filed Dec. 14, 1964, Ser. No. 417,919
Int. Cl. H01l 7/44; B01j 17/22
U.S. Cl. 148—175 9 Claims This invention relates to a semiconductor structure and more particularly to an improved method of fabricating an electrically isolated region or island of semiconductor material in a common substrate suitable for the fabrication therein of a semiconductor device to be utilized in electrical circuits.

In the art of integrated circuits, it is usual to require several circuit components, such as transistors, on a common semiconductor substrate, or chip. It is also usual to require transistors of NPN and PNP conductivity characteristics on the common substrate.

It has been the practice in the art, in order to fulfill the requirements outlined in the preceding paragraph, to provide, for example, a P type silicon wafer with an N type epitaxial layer. Then, in accordance with usual prior art practice, additional P and N regions are diffused into the wafer to provide the desired PNP and NPN characteristics. As is known to the art, the epitaxial film may be grown on a silicon wafer, for example, by the reduction on the substrate of silicon tetrachloride ($SiCl_4$) in a heated reactor. The silicon tetrachloride is reduced by hydrogen to form silicon and gaseous hydrogen chloride on contacting the hot wafer and the epitaxial film is formed on the substrate as a result.

The epitaxial film may be doped while growing to obtain the desired base resistivity, this being achieved by introducing an impurity into the reactor while growing the film. The process is described, for example, in a copending application of John T. Law, Serial No. 168,425, filed January 24, 1962, now U.S. Patent 3,173,814 and assigned to the present assignee.

The epitaxial film defines a region of monocrystalline material whose crystallographic orientation is determined by the wafer on which it is formed. At least one crystallographic plane of the wafer has the same lattice constants as the desired epitaxial film, and the epitaxial film is grown on a surface parallel to that plane. It has been found, insofar as the present invention is concerned, that preferred results are achieved, when the plane corresponding to the Miller Index 100 is used.

One of the problems encountered in attempting to fabricate opposite conductivity multi-transistor integrated circuits by the usual prior art practice, is the difficulty of making multiple diffusions for the NPN transistor structure, and then additional multiple diffusions for the PNP transistor structure; and at the same time, of maintaining the diffused regions of the transistor areas separate and distinct, and with desired configurations of the resulting P-N junctions in the individual transistors.

In addition, saturation problems arise in carrying out the aforesaid prior art multiple diffusion process. As is well known, it is usual in integrated circuits to form a metallized collector connection on the bottom of the substrate. In the prior art integrated circuits, the resistance path from the collector connection to the corresponding P-N junction is extremely high. This creates a high $V_{ce(sat)}$ characteristic.

The $V_{ce(sat)}$ is the voltage drop across the transistor when it is carrying current fully in the forward direction under some specified bias condition. With a high $V_{ce(sat)}$, there is a relatively large power loss in the transistor due to heating. The $V_{ce(sat)}$, therefore, must be low if the transistor is to operate efficiently. To have a low $V_{ce(sat)}$, the resistivity of the emitter and collector must be low, and their conducting paths must be short.

As mentioned above, this is not the case in the usual integrated circuit prior art unit of the general type with which the present invention is concerned. As will be described, the construction of the present invention permits integrated circuit transistors to be provided having a desired relatively low $V_{ce(sat)}$ characteristic.

In general, therefore, the usual processes for providing integrated circuits with multiple transistor areas on a common substrate are difficult and expensive to carry out. In addition, the resulting integrated circuit units themselves have somewhat degraded characteristics, due to their relatively high $V_{ce(sat)}$ characteristic.

An object of the present invention is to provide an improved method of fabricating an integrated circuit structure of low $V_{ce(sat)}$ characteristics, comprising a plurality of opposite conductivity transistors formed in a common substrate.

Another object of the invention is to provide such an improved method which is relatively simple and inexpensive to carry out, and which results in a structure having superior electrical characteristics, as compared with the usual prior art structures of the same general type fabricated by the more complicated usual type of prior art processes.

The process of the invention makes use of the technique of masked area epitaxial growth described, for example, in copending application Serial No. 201,556, filed January 11, 1962, now U.S. Patent No. 3,243,323, in the name of Corrigan et al., entitled "Gas Etching" and assigned to the present assignee.

As explained in the Corrigan application, the usual epitaxial process is carried out by causing the vapor of a source material, such as silicon tetrachloride, to be mixed with hydrogen and caused to flow over the heated surface of a semiconductor substrate, such as silicon. The silicon tetrachloride is reduced by the hydrogen to form silicon and hydrogen chloride gas on contacting the hot substrate. The silicon from this reaction deposits on the surface of the silicon substrate, and a monocrystalline film of silicon grows epitaxially on the substrate. That is, the film has the same crystalline structure as the substrate, by virtue of the orienting influence of the substrate.

The process described in the copending Corrigan application involves the use of a masking material to localize the epitaxial growth to certain well-defined regions on the substrate. This mask may take the form, for example, of a film of material which resists or inhibits the epitaxial growth, and this film is placed over the substrate. The film is provided with openings at selected locations on the substrate, so as to permit the epitaxial growth to take place only at those locations.

For example, when a silicon substrate is used, a thin film silicon dioxide mask may be used. Under normal conditions, the silicon dioxide itself forms a convenient substrate for the growth of the epitaxial film, and is therefore, of little use to perform its desired masking function. However, it has been found that if the silicon dioxide is first treated by heating it in gas phase hydrogen chloride, for example, it will no longer support the nucleation and growth of the epitaxial layer. Then, the silicon dioxide film can be used as a mask against epitaxial growth.

As mentioned above, by providing openings in the masking film before exposure to the gas phase hydrogen chloride treatment, epitaxial growth may be limited to the open region of the film mask, and little or no silicon deposits on the silicon dioxide.

The epitaxial layers may then be grown through the openings in the masking film and on the exposed portions of the silicon wafer substrate. This is achieved, as noted, by heating the wafer in a reactor, and by allowing a gaseous mixture of hydrogen and a chloride compound of the semiconductor material to flow over the exposed surfaces of the wafer.

Then, the gaseous materials tend to react preferentially at the exposed wafer surfaces causing a layer of monocrystalline semiconductor material to grow on the surfaces with the same crystalline orientation as the substrate. In order to dope the epitaxial layer while it grows, a hydride compound of a selected doping impurity may be added to the gaseous material in the reactor. For example, suitable N type impurity dopant compounds are the hydrides and halides of phosphorous arsenic or antimony. Suitable P type impurity dopants, on the other hand, are hydrides and halides of boron.

The epitaxial growth and doping processes may be controlled very accurately so that the epitaxial film can be formed to closely limited impurity concentrations, and to thicknesses of closely held tolerances.

The process of the invention will now be described, in one of its embodiments, with reference to the accompanying drawings, in which.

Figure 2A:
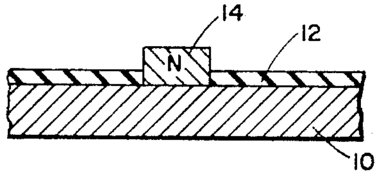
FIGS. 2A, 2B, 2C and 2D are a series of sectional views, on an enlarged scale, showing successive process steps in the practice of the invention.

As a first step in the process of the invention, and as represented in FIG. 2A, for example, a semiconductor body such as wafer 10 is provided. This semiconductor wafer may be composed, for example, of P type silicon. The resistivity of wafer 10 may be of the order of 3 ohm-centimeters, and the thickness of the order of 5.5 mils.

A silicon dioxide ($SiO_2$) masking film 12 is formed on a surface of wafer 10. This film may be formed, for example, by placing the wafer in a reactor 16 of FIG. 1. The oxide film may be produced by subjecting the wafer 10 to a flow of a gaseous mixture consisting of hydrogen ($H_2$) from source 22, silicon tetrachloride ($SiCl_4$) from source 20, and oxygen ($O_2$) from source 19. The reaction is as follows:

$$2H_2+SiCl_4+O_2 \rightarrow SiO_2+4HCl$$

This reaction takes place at a temperature from 700° C. to 1300° C. in the reactor tube. The oxygen and silicon tetrachloride vapor are metered into the reactor in amounts which depend on the temperature used and the silicon dioxide growth rate desired.

A process using silicon tetrachloride and carbon dioxide to form deposited silicon dioxide films can also be used. This process is similar to that used with oxygen and silicon tetrachloride with the exception that the reaction temperature for carbon dioxide ($CO_2$) are from 1100° C. to 1300° C. The reaction is as follows:

$$2H_2+SiCl_4+2CO_2 \rightarrow SiO_2+2CO+4HCl$$

The oxide film may also be produced, for example, by subjecting wafer 10 to two hours of steam from a source 17 followed by two hours of oxygen from a source 19 at a temperature of 1150° C.

As mentioned above, the silicon dioxide layer 12 is to be used as a mask for the surface of wafer 10. A rectangular opening, for example, is provided in the mask, so as to permit the growth of an epitaxial layer through the opening. The epitaxial layer may be doped with an N type impurity and is represented as 14 in FIG. 2A.

The opening may be formed in the mask 12 by usual photolithographic techniques. For example, a photoresist may be placed over the oxide layer 12, and it may be selectively exposed to light in all areas except the defined central area through which the epitaxial layer 14 is to be grown. This selective exposure of the resists may be achieved, for example, by directing ultraviolet light onto the resist through a master pattern of desired configuration. The area of the resist exposed to light becomes strongly adherent to the silicon dioxide layer 12. On the other hand, the portion of the resist, corresponding to the aforesaid central area, which has not been exposed to the light may be readily washed away from the silicon dioxide in any appropriate developing and washing operation.

Following the exposure to light and washing away of the unexposed photo-resist, the opening for the epitaxial layer 14 is formed in the silicon dioxide mask 12 by exposing the assembly, for example, to hydrogen fluoride in the form of dilute hydrofluoric acid or hydrofluoric acid fumes. When referring to the wafer and the layers formed thereon as a whole the expression assembly will be utilized in this description. The silicon dioxide mask is readily etched away by the hydrogen fluoride. However, the resist is impervious to the action, as is the material of the silicon substrate 10 itself. This etching action, therefore, forms a central rectangular opening in the mask, through which the epitaxial layer 14 may be grown.

Figure 1:
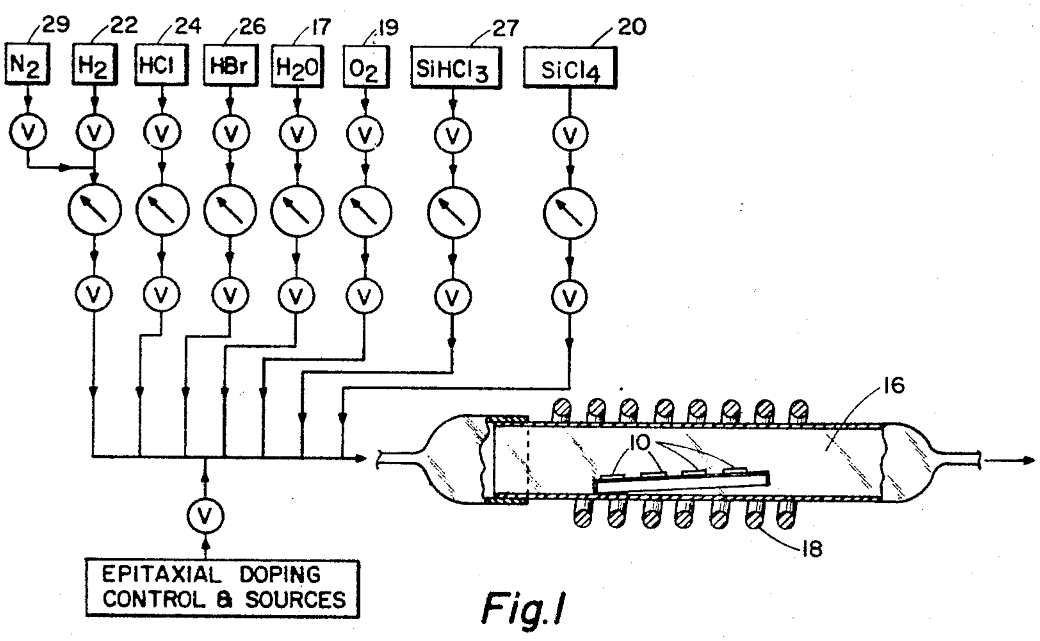
FIG. 1 is a schematic block representation of a reactor and associated components, for producing an epitaxial growth on appropriate wafer.

In order to grow the epitaxial layer, the assembly is placed in the reactor 16 of FIG. 1. The assembly is heated, as by an induction heating coil 18, to a temperature range of 1000° C.–1300° C., for example.

In order to enhance the masking properties of the silicon dioxide layer 12, hydrogen chloride gas from a source 24 is initially caused to flow into the reactor 16. The silicon dioxide film 12 is treated by the hydrogen chloride gas so that it no longer has any capabilities of supporting the growth of the epitaxial layer, and so that it properly performs its masking function, as described in the aforementioned Corrigan application.

Then, the vapor of a suitable source material, such as silicon tetrachloride, derived from a source 20, for example, is mixed with hydrogen derived, for example, from a source 22, and is caused to flow into the reactor 16 and over the heated surface of the assembly. The silicon tetrachloride is reduced by the hydrogen to form silicon and hydrogen chloride gas on contacting the hot assembly.

The silicon from the above reaction deposits on the unmasked portion of the surface of the silicon wafer 10 in a monocrystalline layer 14 that extends upwardly through the opening in mask 12. As mentioned above, epitaxial layer 14 has the same crystalline structure as the wafer 10 by virtue of the orienting influence of the wafer 10.

Hydrogen bromide gas from a source 26 (or hydrogen choride gas) may be introduced into the reactor with the gases from the sources 20 and 22 during the growth of the epitaxial layer. The amount of hydrogen bromide gas from the source 26 (or hydrogen chloride gas) is controlled, so as precisely to determine the flatness or profile of epitaxial layer 14 during its formation.

The epitaxial layer 14 may be either N type or P type, the epitaxial layer being shown as N type in the representation of FIGS. 2A–2D. As mentioned above, the N or P conductivity type of the epitaxial layer may be determined by providing an appropriate dopant impurity in gaseous form in the reactor 16 during the growth of the epitaxial layer.

Figure 2B:
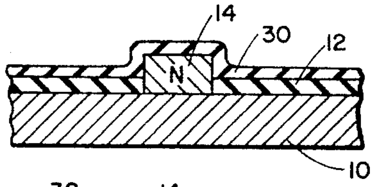

As the next step in the process, and as shown in FIG. 2B, an additional oxide layer 30 may be formed over the epitaxial layer and over the original oxide layer 12. The oxide layer 30 may also be of silicon dioxide, for example, in the embodiment under consideration, and it actually merges with the silicon dioxide layer 12 in areas where it coacts with that layer. The oxide layer 30 may be formed in the reactor 16 in the same manner as the original oxide layer 12.

Figure 2C:
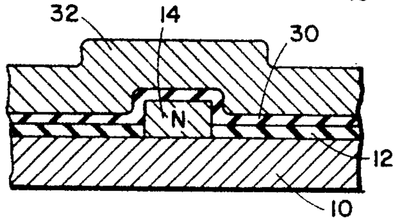

After the additional oxide layer 30 has been formed over the entire assembly, and without removing the assembly from the reactor 16, a deposit of polycrystalline silicon 32, as shown in FIG. 2C, may be formed. This deposit, for example, may be of the order of 5–8 mils thick. The polycrystalline silicon layer 32 is best grown in the reactor 16 by the decomposition of trichlorosilane ($SiHCl_3$) derived from a source 27. The trichlorosilane gas is introduced into the reactor from the source 27 at the proper time and at the temperature of the order of 1100° C.

Reactor 16 may be purged by nitrogen from a source 29, and it is then removed from the reactor 16. The original wafer 10 is then removed, by any appropriate etching, or other technique. The assembly is shown inverted in FIG. 2D, with the wafer 10 removed. The polycrystalline layer 32 may also be flattened out, as shown, by etching, polishing, or other means.

The monocrystalline silicon epitaxial layer 14 now has the form of an island encased by the oxide layers 12 and 30, which have merged into one another. Island 14 is supported in the polycrystalline substrate layer 32. The island 14 in FIG. 2D is so encased by the merged oxide layers 12 and 30, so that a plurality of independent islands can be formed on the common substrate 32, completely isolated from one another.

Also, the improved process of the invention enables the islands to have any desired resistivity, merely by incorporating the appropriate dopant in the reactor while the epitaxial mesa is being grown. Therefore, in a simple and convenient manner, each island 14 can be formed to any specified resistivity or impurity type.

The essential point is either N type or P type islands 14 can be formed, and the doping can be varied in a simple and convenient manner, so as to control precisely the electrical properties of each particular item. This means that the $V_{ce(sat)}$ can be made low, so as to enhance the electrical characteristics of the transistor dependent thereon. In fact, the $V_{ce(sat)}$ can be further reduced by providing a heavily doped N+ region in island 14 adjacent its top surface (FIG. 3A); or by providing an equivalent heavily doped P+ region in a corresponding P type island 14a, adjacent its top surface (FIG. 3B).

Figure 2D:
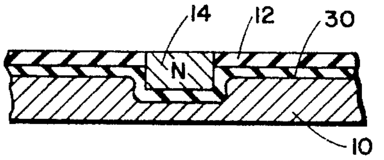

Therefore, island 14 of FIG. 2D could be an N type, as shown, with a heavily doped N+ area adjacent its bottom surface. Conversely, island 14 could be a P type, with a heavily doped P+ area adjacent its bottom surface. In this manner, the $V_{ce(sat)}$ characteristic of the device may be reduced to a relatively low level.

Figure 3A:
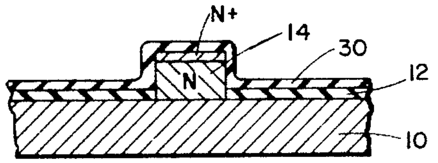
FIG. 3A is a sectional view, on an enlarged scale, showing the manner in which an N type region, with a heavily doped N+ surface area, may be formed on a portion of a wafer in accordance with the concepts of the invention.
Figure 3B:
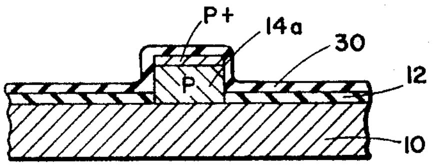
FIG. 3B is a sectional view similarly showing how a P type region, with a heavily doped P+ surface area, may be formed.

The convenient aspect of the process of the invention is that island 14 of FIG. 3A, or island **14*a*** of FIG. 3B, may be doped at will, and at any point during the growth of the respective islands, so that any desired impurity gradient may be achieved.

Figure 4A:
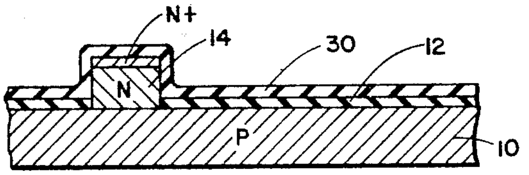
FIGS. 4A, 4B and 4C are a series of enlarged sections showing the manner in which different conductivity regions may be formed in a common substrate by the process of the invention.
Figure 4B:
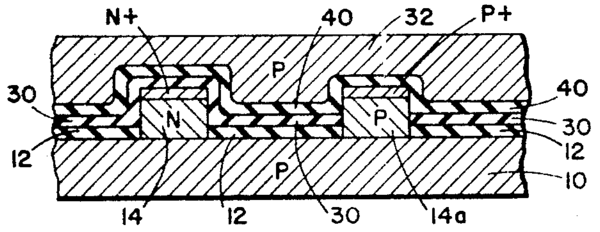
Figure 4C:
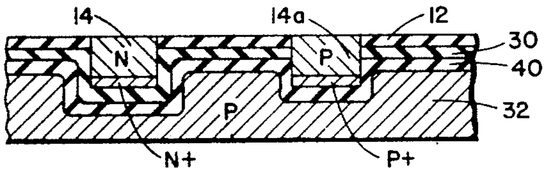

FIGS. 4A through 4C shows the steps by which two separate areas of opposite conductivity types may be formed in the same wafer, by carrying out the process of the present invention. FIG. 4A, for example, the N type island 14 is formed on the wafer 10, and encased in the oxide deposits 12 and 30, in the manner described above. In addition, island 14 may have an N+ area near its surface for low resistivity, formed in the manner described in conjunction with FIG. 3A.

The assembly is then withdrawn from the furnace, and a second aperture, for the P type island **14*a* is formed through the oxide coatings, in the manner described above, in conjunction with FIG. 2. Then, the P type island 14*a* (FIG. 4B) is formed on the exposed surface of the wafer 10, in the manner described above. In addition, island 14*a*** may have a heavily doped P+ area, adjacent its surface, as described in conjunction with FIG. 3B, for reduced resistivity.

An additional oxide layer 40 is then formed over the assembly, and this layer merges with the oxide layers 30 and 12, at the coacting surface. The polycrystalline deposit 32 is then formed, as shown in FIG. 4B, and in the manner described above.

Then, in the same manner, the wafer is etched or polished, so as to expose the surfaces of the islands 14 and **14*a*, as shown in FIG. 4C. That is, as in the previous discussion, the wafer 10 is completely removed to reveal the surfaces of the two islands 14 and 14*a*, both islands being encased by the merged oxide layers 12, 30 and 40**.

The respective N-P-N and P-N-P transistors may then be simply formed in the islands 14 and **14*a*, respectively, by successive diffusion processes. These diffusions can be made first in the island 14, and then in the island 14*a***, by respectively masking the two islands.

Figure 5:
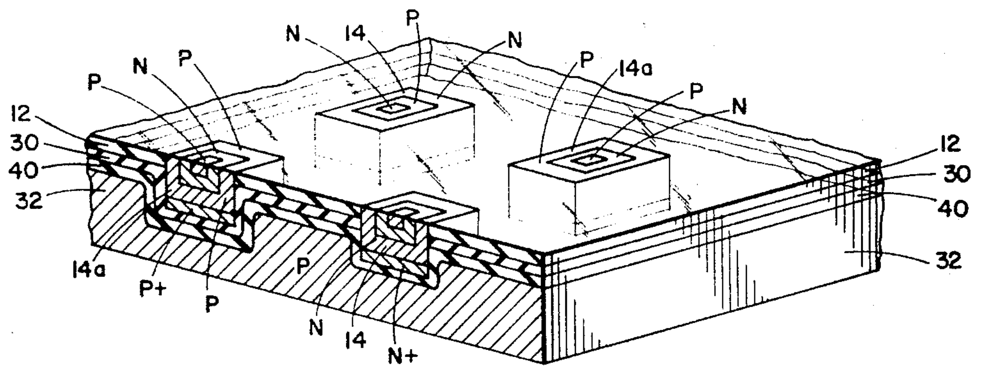
FIG. 5 is a perspective view of an integrated circuit having P-N-P and N-P-N transistor regions formed in a common substrate, in accordance with the concepts of the invention.

The resulting integrated circuit structure may have the form shown in FIG. 5. In that structure, for example, a pair of islands 14 are formed in the assembly or substrate which provide N-P-N transistors. Likewise, a pair of islands **14*a*** are formed which provide P-N-P transistors. These islands are completely isolated and separated from one another, and the respective transistors may be formed simply and by using straightforward and known techniques, insofar as the individual islands are concerned.

An advantage in the resulting integrated circuit is that the resulting individual transistor components are completely isolated from one another by the oxide coatings. This reduces parasitic capacitance between the individual components, for example, to a minimum. This feature is particularly advantageous in that it extends the high frequency capabilities of the individual transistor components.

The improved process of the invention is also advantageous in that it permits the convenient feasibility of placing highly doped N+ and P+ regions at the bottom of the encased islands to form low resistance paths for the collector contact. This region is critical for low $V_{ce(sat)}$, and the resulting low resistivity due to the process and construction of the present invention reduces materially the power dissipated by the transistor components. This feature is particularly important for high power operations, and for optimizing the switching characteristics of the transistors, when they are so used.

Another advantage of the process in construction of the present invention is that the N and P islands 14 and **14*a* are formed essentially of uncompensated material, which is not usually possible in the prior art construction. This means that the subsequent diffusions in these islands, as the respective transistors are formed, will follow closer to the theoretical limits than would be the case when highly compensated material is used. By uncompensated material, it is meant that the N island 14, for example, has a very low background of P type impurities. In other words, sufficient N type impurities can be added to the island 14 generally to override any P type background. The converse applies, of course, to the P type island 14*a***.

The invention provides, therefore, a process for the fabrication of multiple transistors of opposite conductivity types on a single substrate, the improved process of the invention being simple, straightforward and inexpensive. Moreover, the product resulting from the process of the invention is advantageous in that it exhibits improved electrical characteristics.

I claim:

1. A method of forming a semiconductor structure comprising the steps of: (a) providing a crystalline body; (b) masking a surface of said body so that a portion of the surface is exposed; (c) growing an epitaxial layer on said exposed portion of said body; (d) depositing a layer of isolating substance over said epitaxial layer; (e) forming a crystalline substrate over said layer of isolating substance; and (f) removing at least a portion of said first body.

2. A method of forming a semiconductor structure comprising the steps of: (a) providing a semiconductor crystal body; (b) forming a first masking layer over a surface of said body; (c) selectively removing a portion of said masking layer to provide an opening therein to expose a portion of said surface of said body; (d) growing an epitaxial layer on the portion of said body exposed through said opening in said masking layer; (e) depositing a further masking layer over said epitaxial layer; (f) forming a deposit over said further oxide layer; and (g) removing said body to expose a surface of said epitaxial layer.

3. A method of forming a semiconductor structure, comprising the steps of: (a) providing a semiconductor silicon crystal body; (b) providing a first silicon dioxide layer over a surface of said body; (c) selectively removing a portion of said silicon dioxide layer to form an opening therein and exposing a portion of said surface of said body; (d) growing an epitaxial layer on said portion of said body exposed through said opening in said silicon dioxide layer; (e) depositing a further silicon dioxide layer over said epitaxial layer and over said first silicon dioxide layer; (f) forming a polycrystalline deposit on said further silicon dioxide layer; and (g) removing said body to expose a surface of said epitaxial layer.

4. A method of forming a semiconductor structure, comprising the steps of: (a) providing a semiconductor crystal body; (b) forming a first oxide layer over a surface of said body; (c) selectively removing a portion of said oxide layer to form an opening therein and to expose a portion of the surface of said body through said opening; (d) growing an epitaxial layer through said opening in said oxide layer and on said portion of said body exposed by said opening; (e) depositing a further oxide layer over said epitaxial layer and over said first oxide layer; (f) forming a polycrystalline deposit on said further oxide layer; and (g) removing said body to expose a surface of said epitaxial layer.

5. The method defined in claim 4 and which includes the step of introducing a selected impurity dopant into said epitaxial layer as said epitaxial layer is being grown.

6. The method defined in claim 4 including the step of introducing a first concentration of an impurity dopant into said epitaxial layer while said epitaxial layer is growing, and changing to a second concentration of an impurity dopant during said growing so as to form regions having different characteristics within said epitaxial layer.

7. A method of forming an integrated circuit structure comprising the steps of: (a) providing a semiconductor crystal body; (b) depositing a first oxide layer over a surface of said body; (c) selectively removing a portion of said first oxide layer to form an opening therein and expose a first portion of said surface of said body through said opening; (d) growing a first epitaxial layer of a first conductivity type on said first portion of said surface of said body exposed through said opening in said oxide layer; (e) depositing a second oxide layer over said first epitaxial layer and over said first oxide layer; (f) selectively removing a portion of said first and second oxide layers to form a further opening therein and expose a second portion of said surface of said body through said further opening; (g) growing a second epitaxial layer of a second conductivity type on said second portion of said surface of said body exposed through said further opening; (h) depositing a further oxide layer over said second epitaxial layer and over said second oxide layer; (i) forming a crystalline deposit over said further oxide layer; and (j) removing said body to expose a surface of said first epitaxial layer and to expose a surface of said second epitaxial layer.

8. The method defined in claim 7 in which said semiconductor crystal body is formed of silicon, and in which said oxide layers are formed of silicon dioxide.

9. The method defined in claim 7 in which said portions of said oxide layers are selectively removed by photoetching.

References Cited

UNITED STATES PATENTS

| | | | |
|---|---|---|---|
| 3,243,323 | 3/1966 | Corrigan et al. | 148—175 |
| 3,312,879 | 4/1967 | Godejahn | 317—234 |
| 3,320,485 | 5/1967 | Buie | 317—101 |

JOHN W. HUCKERT, Primary Examiner

R. SANDLER, Assistant Examiner

U.S. Cl. X.R.

317—234, 235

Notice of Adverse Decision in Interference

In Interference No. 97,433 involving Patent No. 3,461,003, D. M. Jackson, Jr., METHOD OF FABRICATING A SEMICONDUCTOR STRUCTURE WITH AN ELECTRICALLY ISOLATED REGION OF SEMICONDUCTOR MATERIAL, final judgment adverse to the patentee was rendered Aug. 24, 1972, as to claims 7 and 8.

[*Official Gazette February 6, 1973.*]

Disclaimer 3,461,003.—*Don M. Jackson, Jr.*, Scottsdale, Ariz. METHOD OF FABRICATING A SEMICONDUCTOR STRUCTURE WITH AN ELECTRICALLY ISOLATED REGION OF SEMICONDUCTOR MATERIAL. Patent dated Aug. 12, 1969. Disclaimer filed Apr. 25, 1975, by the assignee, *Motorola, Inc.*

Hereby enters this disclaimer to claims 1 to 9, inclusive, of said patent.

[*Official Gazette August 5, 1975.*]